United States Patent
Liu et al.

(10) Patent No.: US 6,802,945 B2
(45) Date of Patent: Oct. 12, 2004

(54) METHOD OF METAL SPUTTERING FOR INTEGRATED CIRCUIT METAL ROUTING

(75) Inventors: Hsien-Tsung Liu, Hsin-Chu (TW); Chien-Kang Chou, Tainan (TW); Ching-San Lin, Taichung (TW)

(73) Assignee: Megic Corporation, Hsin-Chu (TW)

( * ) Notice: Subject to any disclaimer, the term of this patent is extended or adjusted under 35 U.S.C. 154(b) by 0 days.

(21) Appl. No.: 10/336,871

(22) Filed: Jan. 6, 2003

(65) Prior Publication Data

US 2004/0129558 A1 Jul. 8, 2004

(51) Int. Cl.$^7$ .......................... C23C 14/34; B05D 3/00; C23F 1/00; C25F 5/00
(52) U.S. Cl. ............... 204/192.3; 204/192.12; 427/402; 427/331; 216/39; 216/41; 134/1.1
(58) Field of Search .................. 204/192.12, 192.3; 134/1.1; 216/39, 41; 427/331, 402

(56) References Cited

U.S. PATENT DOCUMENTS

| | | | |
|---|---|---|---|
| 4,704,301 A | 11/1987 | Bauer et al. ................. 427/38 |
| 6,080,529 A | * 6/2000 | Ye et al. ................... 430/318 |
| 6,267,852 B1 | 7/2001 | Givens et al. ......... 204/192.12 |
| 6,340,405 B2 | 1/2002 | Park .......................... 156/345 |
| 6,566,270 B1 | * 5/2003 | Liu et al. ................. 438/706 |

* cited by examiner

*Primary Examiner*—Steven Versteeg
(74) *Attorney, Agent, or Firm*—George O. Saile; Stephen B. Ackerman; Stephen G. Stanton

(57) ABSTRACT

A method of forming a device, comprising the following steps. A wafer holder and inner walls of a chamber are coated with a seasoning layer The wafer is placed upon the wafer holder and is cleaned wherein a portion of the seasoning layer is re-deposited upon the wafer over and between adjacent wafer conductive structures. The wafer is removed from the chamber and at least two adjacent upper metal structures are formed over at least one portion of a metal barrier layer. The exposed portions of the metal barrier layer are etched and removed, exposing portions of the re-deposited seasoning layer portions using the metal barrier layer etch process which also removes any exposed portions of the re-deposited seasoning layer portions that are comprised of a material etchable in the metal barrier layer etch process.

73 Claims, 3 Drawing Sheets

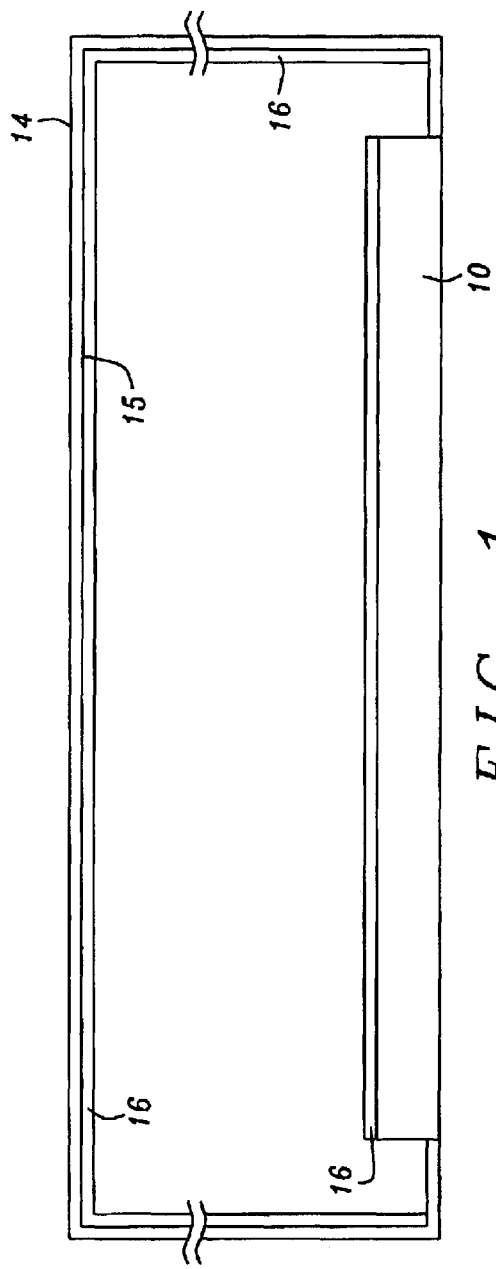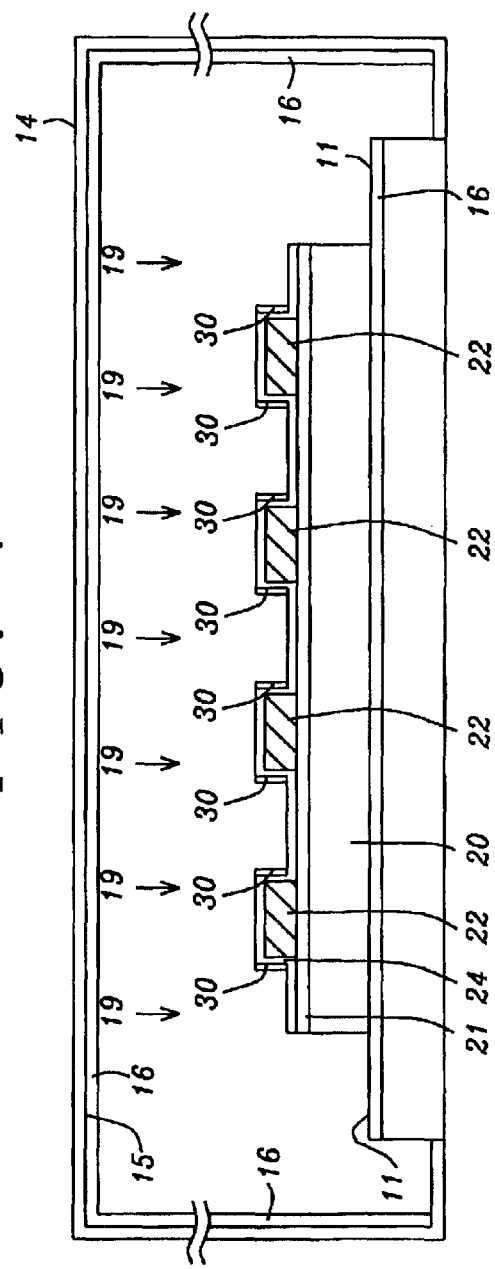

METHOD OF METAL SPUTTERING FOR INTEGRATED CIRCUIT METAL ROUTING

FIELD OF THE INVENTION

The present invention relates generally to fabrication of semiconductor devices, and more specifically to methods of sputtering metal onto structures.

BACKGROUND OF THE INVENTION

Electrical isolation between two conductive structures, such as metal lines or metal bumps, will not be good in current integrated circuit (IC) without planarization. The electrical isolation problem is caused by re-deposition of conductive material/metal from the wafer holder during pre-sputter cleaning forming stringers between adjacent metal conductive structures causing electrical shorting between the structures.

U.S. Pat. No. 4,704,301 to Bauer et al. describes a metal (e.g. aluminum) coater wafer holder.

U.S. Pat. No. 6,267,852 B1 to Givens et al. describes a wafer holder in a sputter clean tool and method.

U.S. Pat. No. 6,340,405 B1 to Park describes a wafer holder in an etch tool.

SUMMARY OF THE INVENTION

Accordingly, it is an object of the present invention to provide improved methods of reducing electrical shorting between adjacent conductive structures formed with a pre-sputtering cleaning step.

Other objects will appear hereinafter.

It has now been discovered that the above and other objects of the present invention may be accomplished in the following manner. Specifically, a wafer holder within a chamber is provided with the chamber having inner walls. The wafer holder and the inner walls of the chamber are coated with a seasoning layer. The seasoning layer being comprised of: a) a material etchable in a metal barrier layer etch process; or b) an insulating or non-conductive material. A wafer is placed upon the seasoning layer coated wafer holder. The wafer including two or more wafer conductive structures thereover. The wafer is cleaned wherein a portion of the seasoning layer is re-deposited upon the wafer over and between adjacent wafer conductive structures. A metal barrier layer is formed over at least over the wafer and the wafer conductive structures. The wafer is removed from the chamber. A patterned masking layer is formed over the metal barrier layer, leaving first exposed portions of the metal barrier layer. Using the patterned masking layer as masks, at least two adjacent upper metal structures are formed over the first exposed portions of the metal barrier layer. The patterned masking layer is removed, exposing second exposed portions of the metal barrier layer adjacent the at least two adjacent upper metal structures. The second exposed portions of the metal barrier layer are etched and removed from over the wafer exposing portions of the re-deposited seasoning layer portions using the metal barrier layer etch process. The metal barrier layer etch process also etching and removing the exposed portions of the re-deposited seasoning layer portions that are comprised of a material etchable in the metal barrier layer etch process.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which:

FIGS. 1 to 5 schematically illustrate in cross-sectional representation a preferred embodiment of the present invention.

DETAILED DESCRIPTION OF THE PREFERRED EMBODIMENTS

Initial Structure—FIG. 1

Figure 3:
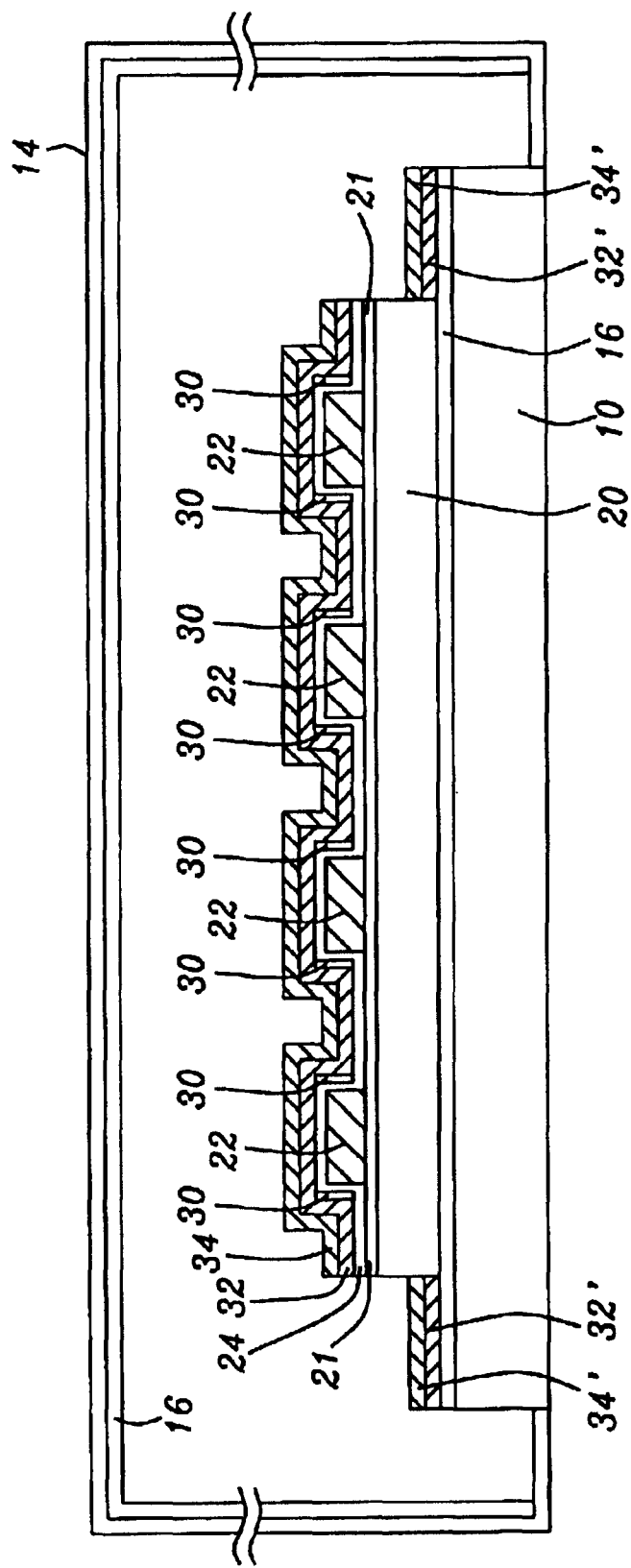

FIG. 1 is a schematic illustration show in a wafer holder 10 within a chamber 14. The wafer holder is preferably comprised of chromium (Cr), iron (Fe), nickel (Ni), manganese (Mn) or molybdenum (Mo) and is more preferably comprised of Cr, Fe or Ni.

In an important step of the invention, the wafer holder 10 (and/or other tools with the chamber 14) and inner chamber walls 15 are coated, or seasoned, with a seasoning layer 16 that is preferably comprised of: (1) a material that is etchable or removable during the metal barrier layer 32 (see below); or (2) an insulating or non-conducting dielectric material. The etchable-material seasoning layer 16 is preferably comprised of TiW or Ti. The insulating material seasoning layer 16 is preferably comprised of silicon oxide, silicon nitride or alumina and is more preferably comprised of silicon oxide.

Seasoning layer 16 preferably has a thickness of: (1) from about 500 to 50,000 Å and more preferably from about 1000 to 10,000 Å when comprised of an etchable-material; and (2) from about 500 to 10,000 Å and more preferably from about 500 to 3000 Å when comprised of an insulating material.

Placement of Wafer 20 Onto Seasoned Wafer Holder 10—FIG. 2

As shown in FIG. 2, a wafer 20 is affixed to the seasoned wafer holder 10. Wafer 20 may be a semiconductor wafer including a semiconductor structure or substrate and active devices therein. Wafer 20 includes adjacent conductive structures 22 thereover with an uppermost intermetal dielectric layer 24 formed over the conductive structures 22. Conductive structures 22 may be comprised of metal, for example, and may be bumps comprised of gold, for example, solder bumps, interconnects comprised of copper, for example, or metal pads.

When the method of the present invention is used for post passivation technology the conductive structures 22 are formed above a wafer 20 passivation layer 21. The passivation layer 21 has a thickness of preferably from about 7000 to 20,000 Å and more preferably from about 10,000 to 15,000 Å and is preferably comprised of silicon oxide, silicon nitride or a composite of silicon oxide and silicon nitride and is more preferably a composite of silicon oxide and silicon nitride.

After placement of the wafer 20 onto the wafer holder 10, portions 11 of the seasoning layer 16 overlying the wafer holder 10 are left exposed.

Pre-Sputter Clean 19—FIG. 2

As shown in FIG. 2, a pre-sputter clean 19 is then performed on the wafer 20. The pre-sputter clean 19 is preferably an argon (Ar$^+$) sputter process and causes re-deposition of some of the seasoning layer 16 from the exposed portions 11 of the seasoning layer 16 onto the intermetal dielectric layer 24 to form intermetal dielectric layer/passivation layer re-deposition portions 30. As shown the re-deposition portions 30 may include stringer portions between adjacent conductive structures.

Formation of Barrier Metal Layer 32 and Seed Metal Layer 34—FIG. 3

As shown in FIG. 3, a barrier metal layer 32 is formed over the intermetal dielectric layer 24 and re-deposited portions 30 over wafer 20. Barrier metal layer portions 32' may be also formed over the exposed portions 11 of the seasoning layer 16 over the wafer holder 10. Barrier metal layer 32/barrier metal layer portions 32' are preferably comprised of TiW or Ti and has a thickness of preferably from about 50 to 5000 Å and more preferably from about 100 to 3000 Å.

A seed metal layer 34 is then formed over the barrier metal layer 32 and seed metal layer portions 34' may be formed over the barrier metal layer portions 32. Seed metal layer 34/seed metal layer portions 34' are preferably comprised of copper (Cu) or gold (Au) and has a thickness of preferably from about 500 to 8000 Å and more preferably from about 800 to 6000 Å.

Formation of Upper Metal Structures 50, 52

Figure 4:
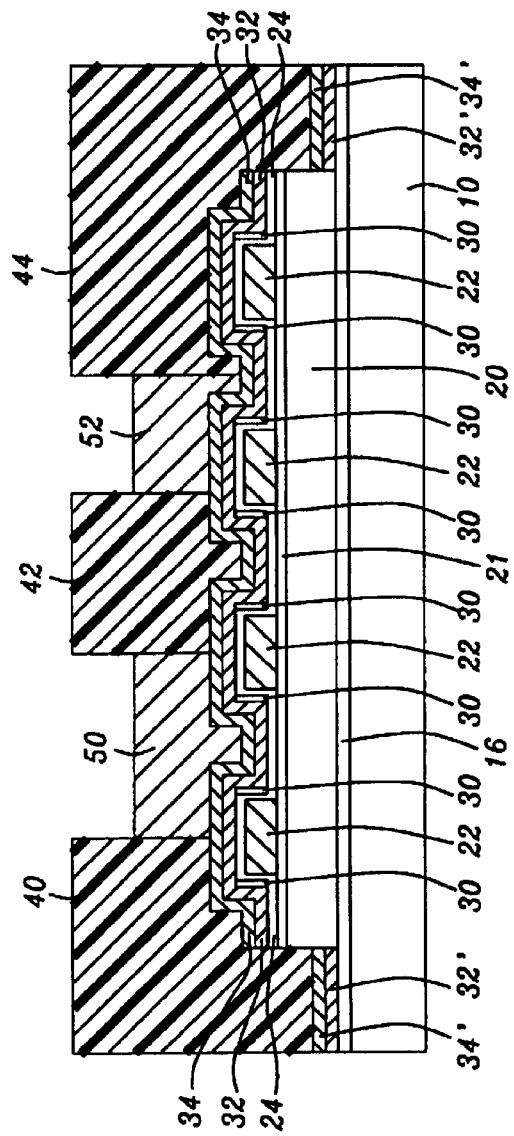

As shown in FIG. 4, wafer 20 is removed from the chamber 14 and patterned mask layer portions 40, 42, 44 may be formed over the structure of FIG. 3 leaving selected portions of the seed metal layer 34 exposed. Patterned mask layer portions 40, 42, 44 are preferably comprised of photoresist.

Then, using the patterned mask layer portions 40, 42, 44 as masks, upper metal structures 50, 52 are then formed over the exposed portions of the seed metal layer 34, preferably using an electroplating process. Upper metal structures 50, 52 are preferably comprised of Cu, Ni, Au, Au/TiW, Cu/Ti, Ni/Cu/Ti, Cu/Cr or Ni/Cu Cr.

Upper metal structures 50, 52 are preferably spaced apart from about 1 μm to 1 mm.

As shown in FIG. 4, one 50 or more of the upper metal structure 50, 52 may serve to electrically connect adjacent conductive structures 22 and one 52 or more of the upper metal structure 50, 52 may serve to electrically connect to a single conductive structure 22.

Removal of Patterned Mask Layer Portions 40, 42, 44 and the Exposed and Then Exposed Portions of Seed Metal Layer 34, 34' And Barrier Metal Layer 32, 32'

Figure 5:
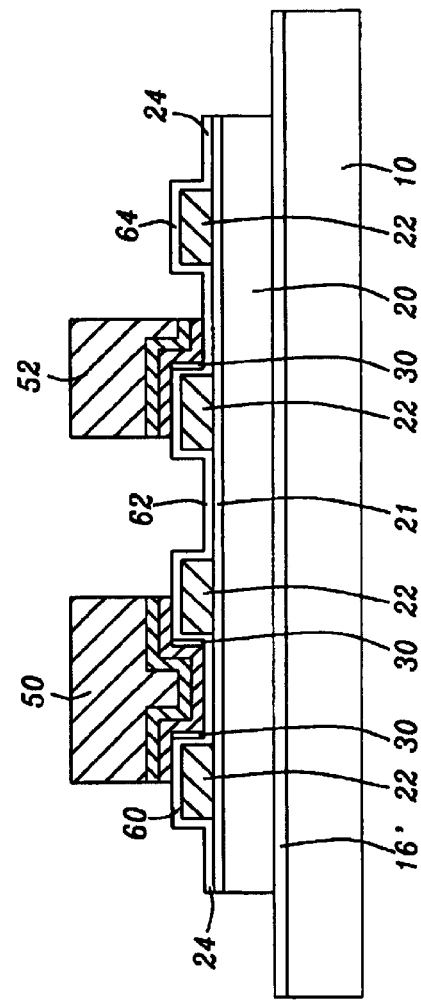

As shown in FIG. 5, the patterned mask layer portions 40, 42, 44 are removed to exposed portions of the seed metal layer 34 formerly thereunder.

The now exposed portions of the seed metal layer 34 over the wafer 20 are etched away as are the portions of the barrier metal layer 32 thereunder to expose portions 60, 62, 64 of the intermetal dielectric layer 24.

It is noted that the upper metal structures 50, 52 are much thicker than the seed metal layer 34 and so are not completely etched away during the etching of the seed metal layer 34. The thicknesses of the upper metal structures 50, 52 can be maintained by controlling the etching time.

It is noted that if the seasoning layer 16 of the present invention was selected to be etchable in the barrier metal layer 32 etch, the re-deposited portions 30 underlying the removed portions of the barrier metal layer 32 are also etched and removed as are any stringers of the re-deposited portions 30 as shown in FIG. 5. Thus, there will be no electrical shorts between adjacent upper metal structures 50, 52.

In the alternative, if the seasoning layer 16 was selected to be comprised of an insulating or non-conducting dielectric material, any re-deposited portions 30/stringers remaining that are under the removed portions of the seed metal layer 34 and barrier metal layer portions 32 over the wafer will not conduct electricity and therefore there will be no electrical shorts between adjacent upper metal structures 50, 52.

Further processing may then proceed.

If the upper metal structures 50, 52 are bumps comprised of gold, then the seasoning layer 16 is preferably comprised of TiW. If the upper metal structures 50, 52 are solder bumps, then the seasoning layer 16 is preferably comprised of Ti. If the upper metal structures 50, 52 are metal interconnects comprised of copper, then the seasoning layer 16 is preferably comprised of Ti.

The method of the present invention is admirably suited for use in bump-on-active (BOA) or pad-on-active (POA) applications.

ADVANTAGES OF THE INVENTION

The advantages of one or more embodiments of the present invention include lower manufacturing cost for post passivation metal routing.

While particular embodiments of the present invention have been illustrated and described, it is not intended to limit the invention, except as defined by the following claims.

We claim:

1. A method of forming a device, comprising the steps of:
providing a wafer holder within a chamber; the chamber having inner walls;
coating the wafer holder and the inner walls of the chamber with a seasoning layer; the seasoning layer being comprised of:
  a) a material etchable in a metal barrier layer etch process; or
  b) an insulating or nonconductive material;
placing a wafer upon the seasoning layer coated wafer holder; the wafer including two or more wafer conductive structures thereover;
cleaning the wafer wherein a portion of the seasoning layer is re-deposited upon the wafer over and between adjacent wafer conductive structures;
forming a metal barrier layer at least over the wafer and the wafer conductive structures;
removing the wafer from the chamber;
forming a patterned masking layer over the metal barrier layer, leaving first exposed portions of the metal barrier layer;
using the patterned masking layer as masks, forming at least two adjacent upper metal structures over the first exposed portions of the metal barrier layer;
removing the patterned masking layer exposing second exposed portions of the metal barrier layer adjacent the at least two adjacent upper metal structures; and
etching and removing the second exposed portions of the metal barrier layer from over the water exposing portions of the re-deposited seasoning layer portions using the metal barrier layer etch process; the metal barrier layer etch process also etching and removing the exposed portions of the re-deposited seasoning layer portions that are comprised of a material etchable in the metal barrier layer etch process.

2. The method of claim 1, whereby the wafer includes a passivation layer formed under the two or more wafer conductive structures.

3. The method of claim 1, including the step of forming a seed metal layer over the barrier metal layer and whereby portions of the seed metal layer overlying the second exposed portions of the metal barrier layer are removed before the removal of the second exposed portions of the metal barrier layer.

4. The method of claim 1, including the step of forming a seed metal layer over the barrier metal layer and whereby portions of the seed metal layer overlying the second exposed portions of the metal barrier layer are removed before the removal of the second exposed portions of the metal barrier layer; the seed metal layer having a thickness of from 500 to 8000 Å and being comprised of copper or gold.

5. The method of claim 1, including the step of forming a seed metal layer over the barrier metal layer and whereby portions of the seed metal layer overlying the second exposed portions of the metal barrier layer are removed before the removal of the second exposed portions of the metal barrier layer; the seed metal layer having a thickness of from about 800 to 6000 Å and being comprised of copper or gold.

6. The method of claim 1, wherein the wafer holder is comprised of Cr, Fe, Ni, Mn or Mo.

7. The method of claim 1, wherein the wafer holder is comprised or Cr, Fe or Ni.

8. The method of claim 1, wherein the seasoning layer is comprised of a material etchable in a metal barrier layer etch process.

9. The method of claim 1, wherein the seasoning layer is comprised of a material etchable in a metal barrier layer etch process and has a thickness of from about 500 to 50,000 Å.

10. The method of claim 1, wherein the seasoning layer is comprised of a material etchable in a metal barrier layer etch process and has a thickness of from about 1000 to 10,000 Å.

11. The method of claim 1, wherein the seasoning layer is comprised of an insulating or non-conductive material.

12. The method of claim 1, wherein the seasoning layer is comprised of an insulating or non-conductive material and has a thickness of from about 500 to 10,000 Å.

13. The method of claim 1, wherein the seasoning layer is comprised of an insulating or non-conductive material and has a thickness of from about 500 to 3000 Å.

14. The method of claim 1, wherein the wafer conductive structures are gold bumps and the seasoning layer is comprised of TiW.

15. The method of claim 1, wherein the wafer conductive structures are solder bumps or copper interconnects and the seasoning layer is comprised of Ti.

16. The method of claim 1, wherein the wafer is cleaned using an argon cleaning process.

17. The method of claim 1, wherein the barrier metal layer has a thickness of from about 50 to 5000 Å.

18. The method of claim 1, wherein the barrier metal layer has a thickness of from about 100 to 3000 Å.

19. The method of claim 1, wherein the at least two adjacent upper metal structures are comprised of Cu, Ni, Au, Au/TiW, Cu/Ti, Ni/Cu/Ti, Cu/Cr or Ni/Cu Cr; and the patterned masking layer is comprised of photoresist.

20. The method of claim 1, including the step of forming an intermetal dielectric layer over the wafer and the two or more wafer conductive structures.

21. The method of claim 1, wherein the seasoning layer is comprised of TiW or Ti.

22. The method of claim 1, wherein the seasoning layer is comprised of silicon oxide, silicon nitride or alumina.

23. The method of claim 1, wherein the seasoning layer is comprised of silicon oxide.

24. The method of claim 1, wherein the wafer is cleaned using an argon sputter cleaning process.

25. A method of forming a device, comprising the steps of:
   providing a wafer holder within a chamber; the chamber having inner walls;
   coating the wafer holder and the inner walls of the chamber with a seasoning layer; the seasoning layer being comprised of:
   a) a material etchable in a metal barrier layer etch process; or
   b) an insulating or non-conductive material;
   placing a wafer upon the seasoning layer coated wafer holder; the wafer including two or more wafer conductive structures thereover;
   cleaning the wafer wherein a portion of the seasoning layer is re-deposited upon the wafer over and between adjacent wafer conductive structures;
   forming a metal barrier layer at least over the wafer and the wafer conductive structures;
   removing the wafer from the chamber;
   forming a patterned masking layer over the metal barrier layer, leaving first exposed portions of the metal barrier layer;
   using the patterned masking layer as masks, forming at least two adjacent upper metal structures over the first exposed portions of the metal barrier layer;
   removing the patterned masking layer exposing second exposed portions of the metal barrier layer adjacent the at least two adjacent upper metal structures; and
   etching and removing the second exposed portions of the metal barrier layer from over the water exposing portions of the re-deposited seasoning layer portions using the metal barrier layer etch process; the metal barrier layer etch process also etching and removing the exposed portions of the re-deposited seasoning layer portions that are comprised of a material etchable in the metal barrier layer etch process;
   whereby the use of the seasoning layer prevents electrical shorts between the at least two adjacent upper metal structures.

26. The method of claim 25, including the step of forming a seed metal layer over the barrier metal layer and whereby portions of the seed metal layer overlying the second exposed portions of the metal barrier layer are removed before the removal of the second exposed portions of the metal barrier layer.

27. The method of claim 25, including the step of forming a seed metal layer over the barrier metal layer and whereby portions of the seed metal layer overlying the second exposed portions of the metal barrier layer are removed before the removal of the second exposed portions of the metal barrier layer; the seed metal layer having a thickness of from about 500 to 8000 Å and being comprised of copper or gold.

28. The method of claim 25, including the step of forming a seed metal layer over the barrier metal layer and whereby portions of the seed metal layer overlying the second exposed portions of the metal barrier layer are removed before the removal of the second exposed portions of the metal barrier layer; the seed metal layer having a thickness of from about 800 to 6000 Å and being comprised of copper or gold.

29. The method of claim 25, wherein the wafer holder is comprised of Cr, Fe, Ni, Mn or Mo.

30. The method of claim 25, wherein the wafer holder is comprised of Cr, Fe or Ni.

31. The method of claim 25, wherein the seasoning layer is comprised of a material etchable in a metal barrier layer etch process.

32. The method of claim 25, wherein the seasoning layer is comprised of a material etchable in a metal barrier layer etch process and has a thickness of from about 500 to 50,000 Å.

33. The method of claim 25, wherein the seasoning layer is comprised of a material etchable in a metal barrier layer etch process and has a thickness of from about 1000 to 10,000 Å.

34. The method of claim 25, wherein the seasoning layer is comprised of an insulating or non-conductive material.

35. The method of claim 25, wherein the seasoning layer is comprised of an insulating or non-conductive material and has a thickness of from about 50 to 10,000 Å.

36. The method of claim 25, wherein the seasoning layer is comprised of an insulating or non-conductive material and has a thickness of from about 500 to 3000 Å.

37. The method of claim 25, wherein the wafer conductive structures are gold bumps and the seasoning layer is comprised of TiW.

38. The method of claim 25, wherein the wafer conductive structures are solder bumps or copper interconnects and the seasoning layer is comprised of Ti.

39. The method of claim 25, wherein the wafer is cleaned using an argon cleaning process.

40. The method of claim 25, wherein the barrier metal layer has a thickness of from about 50 to 5000 Å.

41. The method of claim 25, wherein the barrier metal layer has a thickness of from about 100 to 3000 Å.

42. The method of claim 25, wherein the at least two adjacent upper metal structures are comprised of Cu, Ni, Au, Au/TiW, Cu/Ti, Ni/Cu/Ti, Cu/Cr or Ni/Cu Cr; and the patterned masking layer is comprised of photoresist.

43. The method of claim 25, including the step of forming an intermetal dielectric layer over the wafer and the two or more wafer conductive structures.

44. The method of claim 25, wherein the seasoning layer is comprised of TiW or Ti.

45. The method of claim 25, wherein the seasoning layer is comprised of silicon aoxide, silicon nitride or alumina.

46. The method of claim 25, wherein the seasoning layer is comprised of silicon oxide.

47. The method of claim 25, wherein the wafer is cleaned using an argon sputter cleaning process.

48. A method of forming a device, comprising the steps of:
providing a wafer holder within a chamber; the chamber having inner walls;
coating the wafer holder and the inner walls of the chamber with a seasoning layer; the seasoning layer being comprised of:
a) a material etchable in a metal barrier layer etch process; or
b) an insulating or non-conductive material;
placing a wafer upon the seasoning layer coated wafer holder; the wafer including two or more wafer conductive structures formed over a passivation layer thereover;
cleaning the wafer wherein a portion of the seasoning layer is re-deposited upon the wafer over and between adjacent wafer conductive structures;
forming a metal barrier layer at least over the wafer and the wafer conductive structures;
removing the wafer from the chamber;
forming a patterned masking layer over the metal barrier layer, leaving first exposed portions of the metal barrier layer;
using the patterned masking layer as masks, forming at least two adjacent upper metal structures over the first exposed portions of the metal barrier layer;
removing the patterned masking layer exposing second exposed portions of the metal barrier layer adjacent the at least two adjacent upper metal structures; and
etching and removing the second exposed portions of the metal barrier layer from over the wafer exposing portions of the re-deposited seasoning layer portions using the metal barrier layer etch process; the metal barrier layer etch process also etching and removing the exposed portions of the re-deposited seasoning layer portions that are comprised of a material etchable in the metal barrier layer etch process;
whereby the use of the seasoning layer prevents electrical shorts between the at least two adjacent upper metal structures.

49. The method of claim 48, wherein the passivation layer is comprised of silicon oxide, silicon nitride or a composite of silicon oxide and silicon nitride.

50. The method of claim 48, wherein the passivation layer being comprised of silicon oxide.

51. The method of claim 48, including the step of forming a seed metal layer over the barrier metal layer and whereby portions of the seed metal layer overlying the second exposed portions of the metal barrier layer are removed before the removal of the second exposed portions of the metal barrier layer.

52. The method of claim 48, including the step of forming a seed metal layer over the barrier metal layer and whereby portions of the seed metal layer overlying the second exposed portions of the metal barrier layer are removed before the removal of the second exposed portions of the metal barrier layer; the seed metal layer having a thickness of from about 500 to 80000 Å and being comprised of copper or gold.

53. The method of claim 48, inducting the step of forming a seed metal layer over the barrier metal layer and whereby portions of the seed metal layer overlying the second exposed portions of the metal barrier layer are removed before the removal of the second exposed portions of the metal barrier layer; the seed metal layer having a thickness of from about $00 to 6000 Åand being comprised of copper or gold.

54. The method of claim 48, wherein the wafer holder is comprised of Cr, Fe, Ni, Mn or Mo.

55. The method of claim 48, wherein the wafer holder is comprised of Cr, Fe or Ni.

56. The method of claim 48, wherein the seasoning layer is comprised of a material etchable in a metal barrier layer etch process.

57. The method of claim 48, wherein the seasoning layer is comprised of a material etchable in a metal barrier layer etch process and has a thickness of from about 500 to 50,000 Å.

58. The method of claim 48, wherein the seasoning layer is comprised of a material etchable in a metal barrier layer etch process and has a thickness of from about 1000 to 10,000 Å.

59. The method of claim 48, wherein the seasoning layer is comprised of an insulating or non-conductive material.

60. The method of claim 48, wherein the seasoning layer is comprised of an insulating or non-conductive material and has a thickness of from about 50 to 10,000 Å.

61. The method of claim 48, wherein the seasoning layer is comprised of an insulating or non-conductive material and has a thickness of from about 500 to 3000 Å.

62. The method of claim 48, wherein the wafer conductive structures are gold bumps and the seasoning layer is comprised of TiW.

63. The method of claim 48, wherein the wafer conductive structures are solder bumps or copper interconnects and the seasoning layer is comprised of Ti.

64. The method of claim 48, wherein the wafer is cleaned using an argon cleaning process.

65. The method of claim 48, wherein the barrier metal layer has a thickness of from about 50 to 5000 Å.

66. The method of claim 48, wherein the barrier metal layer has a thickness of from about 100 to 3000 Å.

67. The method of claim 48, wherein the at least two adjacent upper metal structures are comprised of Cu, Ni, Au, Au/TIW, Cu/Ti, Ni/Cu/Ti, Cu/Cr or Ni/Cu Cr; and the patteerned masking layer is comprised of photoresist.

68. The method of claim 48, including the step of forming an intermetal dielectric layer over the wafer and the two or more wafer conductive structures.

69. The method of claim 48, wherein, the at least two adjacent upper metal structures are spaced apart from about 1 μm to 1 mm.

70. The method of claim 48, wherein the seasoning layer is comprised of TiW or Ti.

71. The method of claim 48, wherein the seasoning layer is comprised of silicon oxide, silicon nitride or alumina.

72. The method of claim 48, wherein the seasoning layer is comprised of silicon oxide.

73. The method of claim 48, wherein the wafer is cleaned using an argon sputter cleaning process.

* * * * *